(12) United States Patent
Krokoszinski (10) Patent No.: US 8,962,381 B2
(45) Date of Patent: Feb. 24, 2015

(54) METHOD FOR MANUFACTURING A SOLAR CELL AND A SOLAR CELL MANUFACTURED ACCORDING TO THIS METHOD

(75) Inventor: Hans-Joachim Krokoszinski, Nussloch (DE)

(73) Assignee: Robert Bosch GmbH, Stuttgart (DE)

( * ) Notice: Subject to any disclaimer, the term of this patent is extended or adjusted under 35 U.S.C. 154(b) by 102 days.

(21) Appl. No.: 13/642,099

(22) PCT Filed: Feb. 21, 2011

(86) PCT No.: PCT/EP2011/052503
§ 371 (c)(1),
(2), (4) Date: Dec. 26, 2012

(87) PCT Pub. No.: WO2011/131388
PCT Pub. Date: Oct. 27, 2011

(65) Prior Publication Data
US 2013/0112259 A1    May 9, 2013

(30) Foreign Application Priority Data

Apr. 20, 2010 (DE) .......................... 10 2010 027 940

(51) Int. Cl.
| | | |
|---|---|---|
| H01L 21/00 | (2006.01) | |
| H01L 31/18 | (2006.01) | |
| C23C 10/30 | (2006.01) | |
| C23C 26/00 | (2006.01) | |
| H01L 31/0224 | (2006.01) | |
| H01L 31/068 | (2012.01) | |
| H01L 31/0216 | (2014.01) | |

(52) U.S. Cl.
CPC ............ *H01L 31/1868* (2013.01); *C23C 10/30* (2013.01); *C23C 26/00* (2013.01); *H01L 31/022425* (2013.01); *H01L 31/068* (2013.01); *H01L 31/1804* (2013.01); *H01L 31/02167* (2013.01); *Y02E 10/547* (2013.01)

USPC ........................................ 438/98; 257/E21.135

(58) Field of Classification Search
USPC ............................ 438/557, 559; 257/E21.112
See application file for complete search history.

(56) References Cited

U.S. PATENT DOCUMENTS

| | | | |
|---|---|---|---|
| 3,067,071 A | 12/1962 | Mutter | |
| 8,535,971 B2 * | 9/2013 | Pham et al. | 438/98 |

FOREIGN PATENT DOCUMENTS

| | | |
|---|---|---|
| DE | 35 20 699 | 1/1986 |
| DE | 10 2009 034594 | 8/2010 |

(Continued)

OTHER PUBLICATIONS

International Search Report for PCT/EP2011/052503, dated Dec. 29, 2011.

(Continued)

*Primary Examiner* — Chandra Chaudhari
(74) *Attorney, Agent, or Firm* — Maginot, Moore & Beck LLP (57) ABSTRACT

A method for manufacturing a solar cell from a p-doped or n-doped silicon substrate having a first main surface used as an incident-light side and a second main surface used as a back side includes: depositing a thin layer onto the second main surface; depositing a dielectric, glass-forming paste onto the second main surface and drying it, in order to cover the thin layer; heating and/or sintering the paste on the second main surface at temperatures greater than app. 577° C., to produce an aluminum dopant layer in the second main surface; and removing the glass layer formed during the heating and/or sintering, as well as an aluminum-silicon eutectic layer formed during the heating and/or sintering, from the second main surface.

12 Claims, 4 Drawing Sheets

(56) References Cited

FOREIGN PATENT DOCUMENTS

| EP | 1 906 455 | 4/2008 |
|---|---|---|
| JP | 2002 025926 | 1/2002 |
| WO | WO 2009/101107 | 8/2009 |

OTHER PUBLICATIONS

Gazuz V. et al., "Thin (90um) multicrystalline Si solar cell with 15% efficiency by Al-bonding to glass", 23$^{rd}$ European Photovoltaic Solar Energy Conference, EU PVEC; Proceedings of the International Conference, Held in Valencia, Spain, Sep. 1-5, 2008, pp. 1040-1042.

Cuevas A Ed, Institute of Electrical and Electronics Engineers: "A good recipe to make silicon solar cells", Proceedings of the Photovoltaic Specialists Conference. Las Vegas, Oct. 7-11, 1991, New York, IEEE, U.S., Conf. 22, Oct. 7, 1991, pp. 466-470.

Rauer, M. et al., "Passivation of screen-printed aluminium-alloyed emitters for back junction n-type silicon solar cells", 24$^{th}$ European Photovoltaic solar energy conference, proceedings of the 24$^{th}$ international conference, WIP-renewable energies, Sep. 21, 2009, pp. 1059-1062.

\* cited by examiner

METHOD FOR MANUFACTURING A SOLAR CELL AND A SOLAR CELL MANUFACTURED ACCORDING TO THIS METHOD

BACKGROUND OF THE INVENTION

1. Field of the Invention

The present invention relates to a method for manufacturing a solar cell, as well as to a solar cell manufactured according to this method.

2. Description of the Related Art

Silicon solar cells are often provided with a metallic coating over an entire surface for reflection and for charge collection on the back side. This backside metallic coating is made of, as a rule, aluminum-based, thick-film paste, which is printed between silver-based soldering surfaces, over a large surface. When sintered above 800° C., the aluminum partially alloys with the upper semiconductor surface by forming the low-melting point (577° C.) AlSi eutectic and recrystallizing, and in the process, it over-compensates for the existing $n^+$-doping from the phosphorus diffusion that had previously occurred all-around, to form highly p-doped ($p^+$-)doping (see F. Huster, 20th European Photovoltaic Solar Energy Conference, Jun. 6-10, 2005, Barcelona, Spain). When the base doping is p, the aluminum-doped, recrystallized surface layer forms a $p^+$-BSF (back surface field) having a $p^+p$-transition (high-low transition).

For several years, the same cell structure has also been produced on n-doped silicon, using a virtually identical process. Then, the above-mentioned, aluminum-doped surface of the back side becomes the $p^+$-emitter, and the phosphorus-doped layer of the front side becomes the front surface field (FSF).

A disadvantage of the methods known from the related art is that the printed aluminum paste layer must be app. 40 μm thick (after the sintering), in order to obtain sufficiently deep alloy formation or aluminum doping depth. Due to the bimetallic effect between it and the silicon wafer, a reduction in the wafer thickness below the 180 μm typical up to now results in wafer deformation (so-called bow) that is no longer tolerable. High costs for the solar cell result from the necessary thickness of the silicon wafer and the amount of silicon consequently needed.

The screen-printed metallic coating of the back side has an imperfect reflection factor of only 65% for the long-wave portions of the sunlight, which penetrate to the back side. An effective reflectivity of >90% would increase the optical path length of the incident light and, therefore, the generation of electron-hole pairs (that is, the current) in the interior of the cell. Consequently, a marked gain in efficiency would be obtained.

In spite of the field passivation by heavy doping, a metallic surface, both that of an emitter and that of a back surface field (BSF), has a large charge-carrier recombination rate. In order to allow more effective passivation of the aluminum-doped surface of the back side, the thick, screen-printed aluminum layer needed as a dopant source and the AlSi eutectic layer formed between it and the semiconductor surface must be etched off. In the previously known methods, a large amount of hydrochloric acid is necessary for that purpose, due to the thickness of the layers to be etched off. This constitutes a large waste disposal problem.

BRIEF SUMMARY OF THE INVENTION

The subject matter of the present invention is a method for manufacturing a solar cell from a p-doped or n-doped silicon substrate, which has a first main surface used as an incident-light side in a state of operation, and a second main surface used as a back side; the method including the following steps: depositing a thin layer, which mainly includes aluminum, onto the second main surface; depositing a dielectric, glass-forming paste onto the second main surface and drying it, in order to cover the thin layer; heating and/or sintering the paste on the second main surface, in particular, at temperatures greater than app. 577° C., in order to produce an aluminum dopant layer in the second main surface; and removing the glass layer formed during the heating and/or sintering, as well as an aluminum-silicon eutectic layer formed during the heating and/or sintering, from the second main surface, through which the aluminum dopant layer is exposed.

An advantage of this method is that a solar cell, which has an aluminum dopant layer on the back side and allows passivation of the aluminum-doped back side, is manufactured in a technically simple and inexpensive manner. A further advantage of this is that the aluminum layer is deposited so as to be in direct contact with the entire main surface. In this manner, in the case of melting at the eutectic point, the entire amount of aluminum in the layer may be used directly, that is, without delay and/or without hindrance, for forming a melt. The aluminum-silicon melt flows uniformly on the entire second main surface. In addition, the aluminum layer is completely covered by the glass layer, so that when the aluminum-silicon eutectic melts, the melted layer is not exposed at any place. This means that coalescing to form drops, spattering and/or oxidizing are substantially prevented. Since the glass layer is intended as a temporary cover for the thin aluminum layer and is removed again after the doping, the thickness may be selected to be as low as possible. Thus, the glass layer may be removed again more easily and more rapidly. It is also advantageous that the glass layer has a low expansion coefficient that is similar to the silicon of the silicon substrate, which means that bowing of the silicon substrate is substantially prevented. Therefore, the silicon substrate may have a markedly lower thickness. Together, these result in the efficiency of the solar cell being higher and the manufacturing costs of the solar cell being markedly reduced.

The heating and/or sintering may proceed at a temperature of at least 800° C. By this means, it is ensured that the aluminum layer forms, together with the silicon, a liquid aluminum-silicon eutectic layer.

In the method, the paste may be applied by printing, in particular, by screen printing. By this means, the costs of the method may be reduced further.

In one specific embodiment of the method, the glass layer and the aluminum-silicon eutectic layer are etched away from the second main surface, using, in particular, hydrofluoric acid and hydrochloric acid, respectively. An advantage of this is that the layers are uniformly removed from the second main surface, using a proven method. In addition, it is advantageous that less hydrochloric acid is needed due to the low thickness of the aluminum-silicon eutectic layer, which lowers the costs and the degree of complexity, since the disposal of hydrochloric acid is very expensive and complicated.

In the method, metallic contact tracks for contacting the silicon substrate, and optionally, bus bars for electrically connecting the metallic contact tracks, may be deposited onto the first main surface; during the heating and/or sintering of the paste on the second main surface, the metallic contact tracks and the optional bus bars being simultaneously heated and/or sintered. The charges near the first main surface are collected by the metallic contact tracks, and the charges of a plurality of metallic contact tracks are collected by optional bus bars. Furthermore, it is advantageous that by jointly heating or sintering the metallic contact tracks and the optional bus bars and the paste on the second main surface, an additional step, which would be necessary for heating and/or sintering the metal contact tracks and the optional bus bars, is eliminated.

The metallic contact tracks and optional bus bars may be deposited by printing a silver paste and/or spraying on an aerosol ink containing silver and/or extruding a silver paste from thin tubes. A uniform thickness of the metallic contact tracks and optional bus bars is ensured by these cost-effective methods for depositing the metallic contact tracks and optional bus bars.

In a further specific embodiment of the method, prior to depositing the paste onto the second main surface, a thin dielectric layer, in particular, including an oxide and/or a nitride, is also deposited onto the thin layer to prevent oxidation of the aluminum of the thin layer by air. By this means, it is ensured that the thin aluminum layer is not oxidized, which would have a negative effect on the production of an aluminum eutectic or the aluminum dopant layer.

In a further specific embodiment of the method, after the aluminum dopant layer is exposed, a passivation layer is also deposited onto the second main surface, the passivation layer is removed from regions of the second main surface to form openings, and, using, in particular, a PVD method, preferably, sputtering and/or vapor deposition, a further aluminum layer is deposited onto the second main surface, in order to contact the aluminum dopant layer in the openings. The efficiency of the solar cell is increased by the passivation layer. In addition, it is advantageous that the second main surface of the silicon substrate is contacted by the further aluminum layer in a technically simple manner. Also, the no-load voltage may be increased. Furthermore, compared to a porous aluminum layer, the passivation layer and the further aluminum layer form, together, an improved infrared light mirror on the second main surface, through which a higher current yield per cell is obtained.

The passivation layer may be removed from regions of the second main surface, using laser ablation, etching paste and/or ion etching. By this means, the costs and the degree of complexity of the method are further reduced, since proven methods for removing the passivation layer are used.

In the method, a base layer containing nickel may also be deposited onto the further aluminum layer of the second main surface, in order to allow it to be built up chemically and/or galvanically. By this means, the deposition of further layers onto the second main surface is facilitated considerably.

In the method, after the deposition of the aluminum layer and the optional nickel-containing layer onto the second main surface, an insulating layer may also be deposited onto the second main surface, and using, in particular, laser ablation, etching paste and/or ion etching, the insulating layer may be removed from regions of the second main surface to re-expose the soldering surfaces, in order to allow subsequent chemical and/or galvanic building-up of the soldering surface openings. By this means, it is ensured that deposited layers for building-up are limited to the soldering surface openings, that is, that deposition of further layers onto only the soldering surface openings is made considerably easier.

In the method, a solderable layer or sequence of layers including, in particular, nickel, silver, copper and/or tin, may also be galvanically and/or chemically deposited onto the metallic contact tracks of the first main surface and the soldering surface openings of the second main surface; the building-up layer of the first main surface also being able to be different from the layer of the second main surface. By this means, soldering surfaces, which may easily be contacted via soldering, are produced in order to electrically contact the second main surface of the silicon substrate.

The subject matter of the present invention also includes a solar cell made from a p-doped or n-doped silicon substrate, which has a first main surface used as an incident-light side in a state of operation, and a second main surface used as a back side; the second main surface having an aluminum dopant layer, and the silicon substrate having a thickness of less than app. 200 µm, in particular, less than app. 180 µm. An advantage of this solar cell is that due to the lower thickness, less silicon is needed for the silicon substrate, which reduces costs.

DETAILED DESCRIPTION OF THE INVENTION

In the following description, like reference numerals are used for parts that are identical or function in the same manner.

Figure 1:
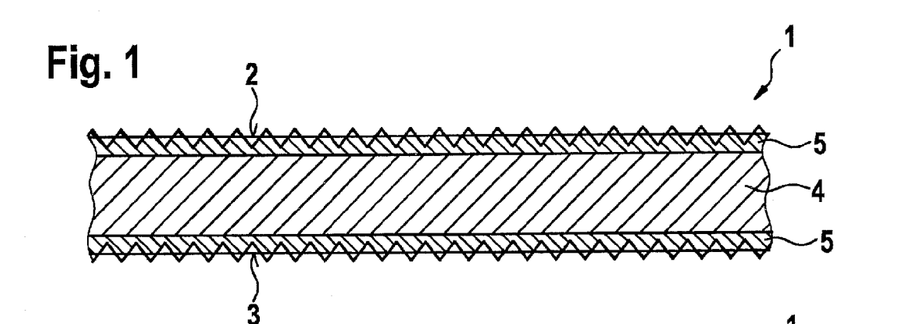
FIG. 1-FIG. 14 show cross-sectional views of a silicon substrate after different steps of a method according to the present invention.

FIG. 1 shows a cross-sectional view of a silicon substrate 1, which is used as a starting silicon substrate for the method of the present invention. Silicon substrate 1 has a first main surface 2, which is used as an incident-light side in a state of operation, and a second main surface 3, which is used as a back side in the state of operation. Silicon 4 of silicon substrate 1 is n-doped or p-doped. Silicon 4 of silicon substrate 1 may be monocrystalline or polycrystalline. First main surface 2 and second main surface 3 have been etched to remove saw damage. In addition, silicon substrate 1 has been textured on both sides. A phosphorus dopant layer 5 is situated in first 2 and second main surface 3. Phosphorus dopant layer 5 was produced, for example, by diffusion and a subsequent driving-in step. After that, the phosphorus silicate glass produced by the diffusion and subsequent driving-in step was removed from the two main surfaces 2, 3.

Figure 2:
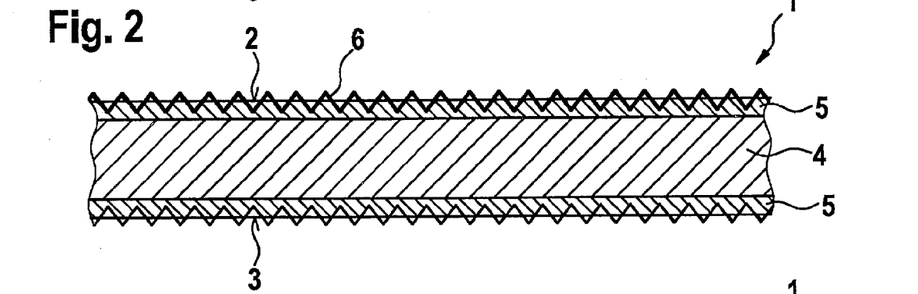

FIG. 2 shows silicon substrate 1 after a first step of the method according to the present invention. In this connection, an antireflection layer or antireflection layer sequence 6 was deposited onto first main surface 2 of silicon substrate 1, for example, by oxidation and/or PECVD methods or other known methods. Antireflection layer or antireflection layer sequence 6 includes a silicon nitride layer and/or a silicon oxide/silicon nitride layer sequence. This is additionally used as a passivation layer of the first main surface.

Figure 3:
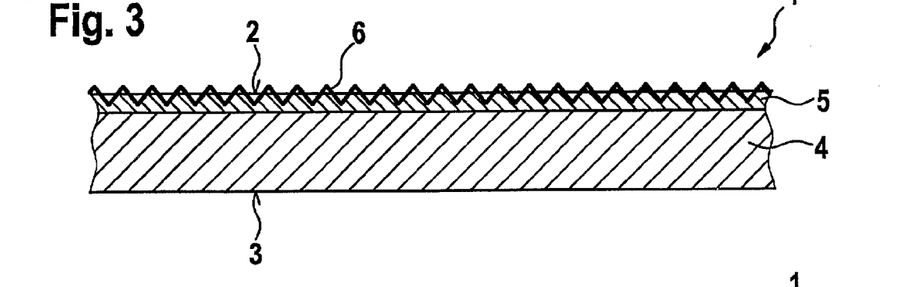

FIG. 3 shows a cross-sectional view of silicon substrate 1 after a further, optional method step. In the method step, phosphorus dopant layer 5 of second main surface 3 is etched away. By this means, the texturing of second main surface 3 is also smoothed out. Potassium hydroxide solution or HF/HNO$_3$ is preferably used for this. If phosphorus dopant layer 5 of second main surface 3 is not removed, the subsequent doping with aluminum must over-compensate for the phosphorus doping of second main surface 3. In addition, without this optional method step, the texture of second main surface 3 is retained.

Figure 4:
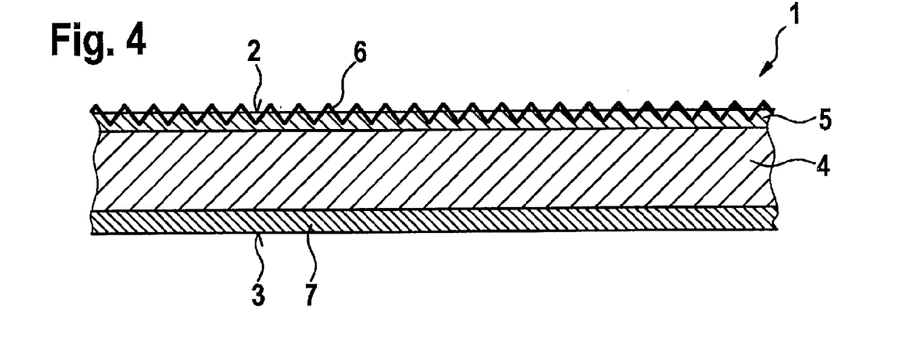

In the next method step, a thin aluminum layer 7 of a few micrometers, which is as pure as possible, is deposited onto second main surface 3. An aluminum layer 7, which is as pure as possible, is to be understood as a layer that essentially contains only aluminum. Thin aluminum layer 7 is deposited over the entire second main surface 3, for example, by vapor deposition or sputtering, up to a distance from the edge of silicon substrate 1 that is as short as possible. The distance from the edge may also be zero. FIG. 4 shows silicon substrate 1 after this method step. The thickness of thin aluminum layer 7 is selected with regard to the desired depth of the aluminum dopant layer 8 produced in a subsequent method step. The depth of aluminum dopant layer 8 may be between 1 μm and 10 μm. Aluminum dopant layer 8 acts as an emitter or as a back-surface field as a function of the doping of silicon substrate 1.

Figure 5:
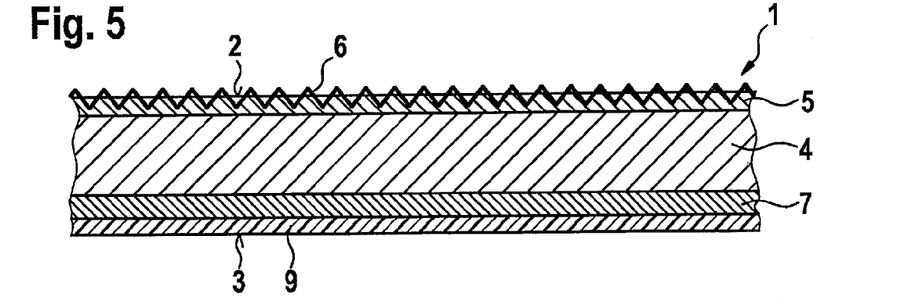

A cross-sectional view of silicon substrate 1 after a further, optional method step is shown in FIG. 5. In the sputtering or vapor deposition system used for depositing thin aluminum layer 7, for example, thin aluminum layer 7 may be covered with a thin dielectric layer 9, which preferably includes an oxide and/or a nitride. In this manner, it is ensured that substantially no oxidation of the aluminum of thin aluminum layer 7 by air takes place.

Figure 6:
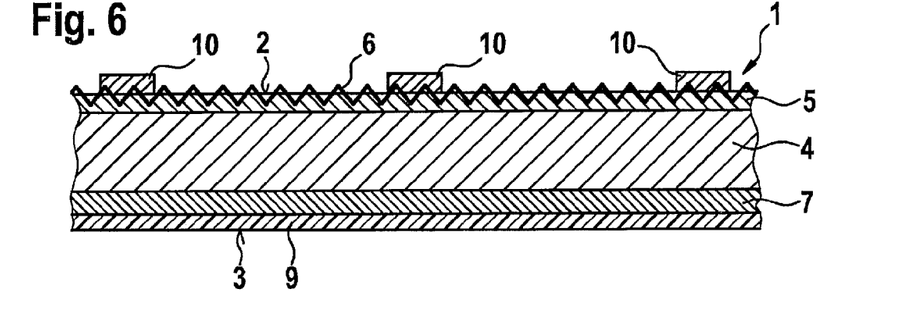

In the next method step, metallic contact tracks 10, so-called metal fingers, and optional collecting bars, so-called bus bars, are deposited onto first main surface 2. The width of metallic contact tracks 10 or metal fingers is as small as possible. FIG. 6 shows a cross-sectional view of silicon substrate 1 after this deposition. The deposition may be accomplished, using one of the methods known from the related art. Metallic contact tracks 10 and the bus bars are preferably printed with a silver paste, sprayed using aerosol ink containing silver, or extruded from thin tubes.

First main surface 2 may be provided with, or have, selective doping, i.e., doping at a higher dopant concentration and/or a dopant layer extending deeper into silicon substrate 1, in particular, underneath the metallic contact tracks and/or bus bars.

Figure 7:
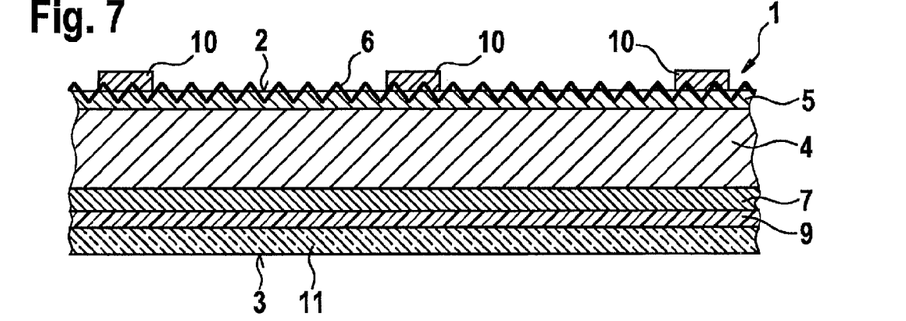

FIG. 7 shows a cross-sectional view of a silicon substrate 1 after the next method step. In this method step, a dielectric, glass-forming paste 11 is deposited onto the entire second main surface 3 and dried. Paste 11 covers thin aluminum layer 7 completely. This cover of thin aluminum layer 7 is intended to be a temporary cover during the method and is removed again after second main surface 3 is doped with aluminum. Therefore, the thickness of deposited paste 11 is selected to be as low as possible. The thickness is typically 10 μm-12 μm.

Figure 8:
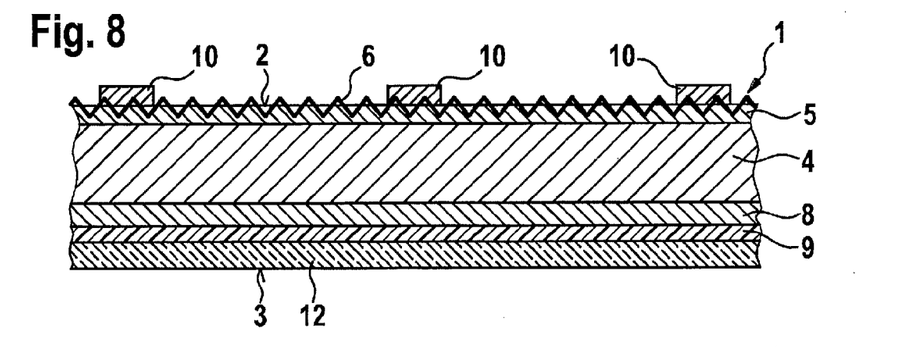

In the next method step, paste 10 and glass-forming paste 11 are simultaneously sintered or heated on first main surface 2 and second main surface 3, respectively, at temperatures preferably above 800° C.; the paste being sintered or heated to form metallic contact tracks and optional bus bars. When heated above 577° C., thin aluminum layer 7 and silicon 4 form a liquid eutectic AlSi phase at second main surface 3. FIG. 8 shows a cross-sectional view of silicon substrate 1 after this method step. At each time, the thickness of the liquid eutectic layer under glass paste 11 or glass cover 12 is a function of the temperature presently prevailing and the thickness of thin aluminum layer 7. After briefly heating it above 800° C., in response to cooling off to below the eutectic temperature (app. 577° C.), the aluminum-doped crystalline layer recrystallizes from the inside to the outside to form a p$^+$ layer, which constitutes the emitter in the case of an n-doped silicon substrate 1, and the back-surface field in the case of a p-doped silicon substrate 1. FIG. 8 shows a cross-sectional view of silicon substrate 1 after this method step, in which an aluminum dopant layer 8 is formed on second main surface 3. Glass paste 11 or glass cover 12 prevents oxidation of the liquid AlSi eutectic layer.

Figure 9:
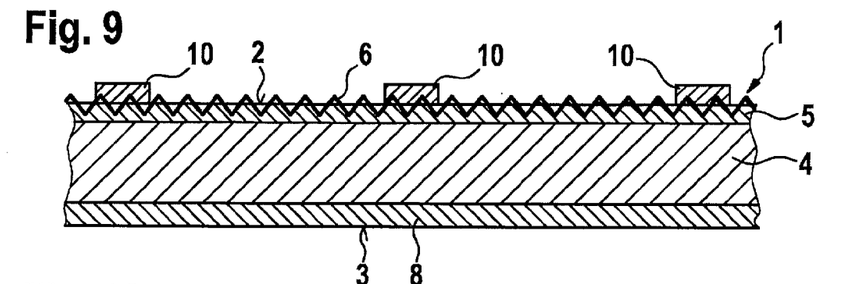

The remaining eutectic melt in the form of boundary phases of the phase diagram subsequently solidifies to form the AlSi layer having a granular structure. After the doping of second main surface 3 with aluminum, all of the layers on second main surface 3 above aluminum dopant layer 8 are removed. To this end, dielectric layer 12 and optional dielectric layer 9 are initially etched off using hydrofluoric acid, and the remaining layers containing AlSi and aluminum are subsequently etched off using a suitable acid. The silicon substrate 1 after this method step may be seen in FIG. 9. The layers on first main surface 2 are essentially not attacked by this etching operation.

Since the glass layer is only needed temporarily, its thickness may be selected to be as small as possible, preferably, between 10 μm and 12 μm. Because of the lower thickness, less acid is required for re-dissolving or removing this layer. In comparison with the removal of a 40 μm thick aluminum layer or screen-printed aluminum layer according to the related art, an amount of acid, in particular, hydrofluoric acid, is needed that is lower by at least a factor of 4.

Figure 10:
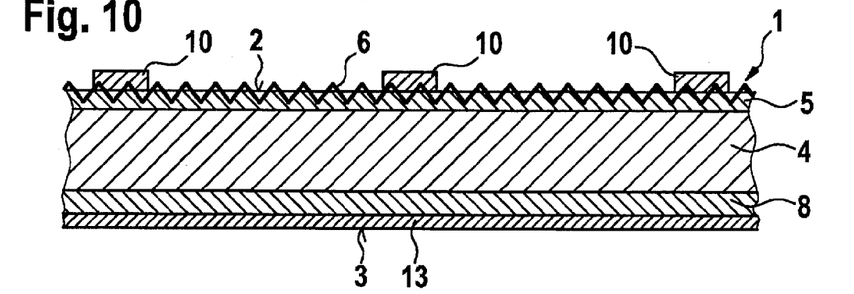
Figure 11:
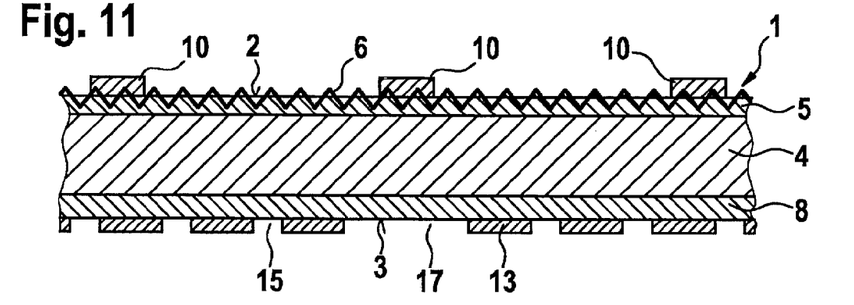

The newly exposed silicon surface of second main surface 3, which is doped with aluminum, is now coated with a passivation layer 13 suitable for p$^+$-doping (see FIG. 10). Subsequently, passivation layer 13 is locally opened using a known method, for example, using laser ablation, etching paste and/or ion etching. In this context, the regions (openings 15 for local contacts and soldering surface regions 17), at which the solderable metallic surfaces (collecting bars or bus bars or soldering contact surfaces) are supposed to be deposited on second main surface 3 in later method steps, are also exposed. A cross-sectional view of the silicon substrate 1 having locally opened passivation layer 13 may be seen in FIG. 11.

Figure 12:
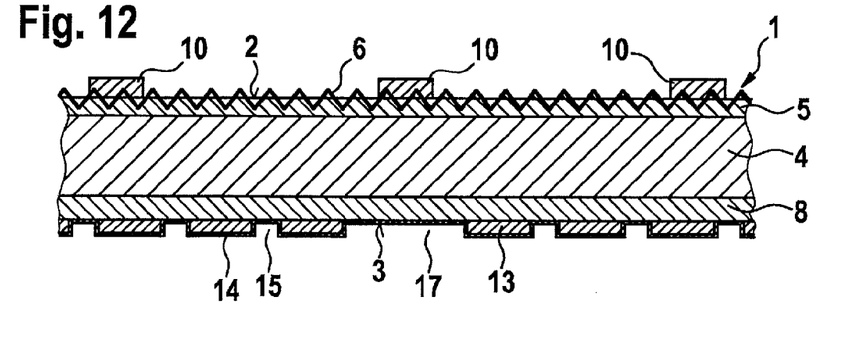

The entire second main surface 3 is subsequently covered with a further aluminum layer 14, using a PVD method known from the related art, e.g., by sputtering or vapor deposition. Further aluminum layer 14 is sufficiently thick and directly contacts aluminum dopant layer 8 of second main surface 3 of silicon substrate 1 in the open regions or openings 15, 17, and in all of the other regions of second main surface 3, it is situated on passivation layer 13. FIG. 12 shows a cross-sectional view of silicon substrate 1 after this method step. In the same PVD system, a thin layer containing nickel is advantageously deposited onto further aluminum layer 14, in order to be able to more easily deposit, later in the method, a solderable layer in the bus-bar regions or soldering contact surface regions, in a chemical or galvanic process.

Figure 13:
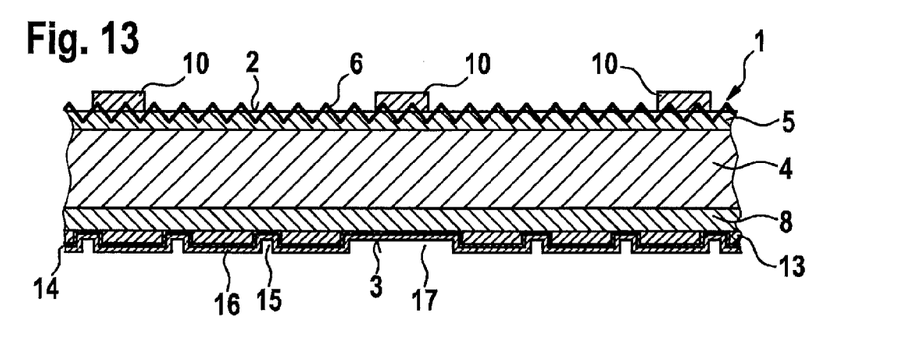

In a further method step, in the same system, a thin dielectric or insulating layer 16 is deposited onto the entire second main surface 3, in order to limit the building-up to the soldering surface regions. Using one of the known methods (laser ablation, etching paste, ion etching), this dielectric insulating layer 16 is subsequently opened in the soldering surface regions to form soldering surface openings 17. The silicon substrate after this method step may be seen in FIG. 13. By this means, subsequent chemical and/or galvanic building-up 18 exclusive of soldering surface openings 17 is rendered possible or made easier.

Figure 14:
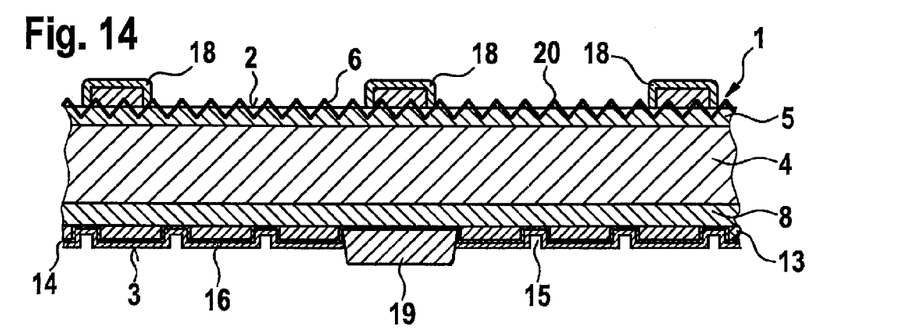

As a final method step, metallic contact tracks 10 of first main surface 2 and soldering contact surfaces 17 of second main surface 3 are built up with a solderable layer sequence 18, 19. This solderable layer sequence 19 is made up of a suitable combination of the metals nickel, silver, copper and/or tin. The deposition of solderable layer sequence 19 may be accomplished galvanically or chemically. FIG. 14 shows a cross-sectional view of silicon substrate 1 after this last method step.

At this point, it is emphasized that all of the above-described steps of the method, alone and in any combination, in particular, the details illustrated in the drawing, are claimed as essential to the present invention. Modifications to them are familiar to one skilled in the art.

In all other respects, the implementation of the present invention is not limited to the above-described examples and emphasized aspects, but only by the scope of protection of the appended claims.

What is claimed is:

1. A method for manufacturing a solar cell from one of a p-doped or n-doped silicon substrate having a first main surface used as an incident-light side during operation and a second main surface used as a back side, the method comprising:

depositing a thin layer mainly including aluminum onto the second main surface;

depositing a dielectric, glass-forming paste onto the second main surface and drying the paste, in order to cover the thin layer;

at least one of heating and sintering the paste on the second main surface at temperatures greater than approximately 577° C. to produce an aluminum dopant layer in the second main surface; and removing from the second main surface (i) the glass layer formed during the at least one of heating and sintering, and (ii) an aluminum-silicon eutectic layer formed during the at least one of heating and sintering, thereby exposing the aluminum dopant layer.

2. The method as recited in claim 1, wherein the at least one of heating and sintering is performed at a temperature of at least 800° C.

3. The method as recited in claim 1, wherein the paste is deposited by screen printing.

4. The method as recited in claim 1, wherein the glass layer is removed from the second main surface by etching using hydrofluoric acid, and the aluminum-silicon eutectic layer is removed from the second main surface by etching using hydrochloric acid.

5. The method as recited in claim 1, further comprising:
depositing onto the first main surface (i) metallic contact tracks for contacting the silicon substrate, and (ii) bus bars for electrically connecting the metallic contact tracks;
wherein, during the at least one of heating and sintering of the paste on the second main surface, the metallic contact tracks and the bus bars are at least one of simultaneously heated and sintered.

6. The method as recited in claim 5, wherein the metallic contact tracks and the bus bars are deposited by at least one of (i) printing a silver paste, and (ii) spraying on an aerosol ink containing silver, and (iii) extruding a silver paste from thin tubes.

7. The method as recited in claim 1, further comprising:
depositing, prior to the deposition of the paste onto the second main surface, a thin dielectric layer containing at least one of an oxide and a nitride onto the thin layer to prevent oxidation of the aluminum of the thin layer by air.

8. The method as recited in claim 1, further comprising:
performing the following after the aluminum dopant layer is exposed:
depositing a passivation layer onto the second main surface;
removing the passivation layer from regions of the second main surface to form openings; and
depositing a further aluminum layer onto the second main surface using at least one of sputtering and vapor deposition, in order to contact the aluminum dopant layer in the openings.

9. The method as recited in claim 8, wherein the passivation layer is removed from regions of the second main surface using at least one of laser ablation, etching paste and ion etching.

10. The method as recited in claim 8, further comprising:
depositing a base layer containing nickel onto the further aluminum layer of the second main surface, in order to allow at least one of chemical and galvanic building-up.

11. The method as recited in claim 8, further comprising:
performing the following after the deposition of the further aluminum layer onto the second main surface:
depositing an insulating layer onto the second main surface; and
removing, using at least one of laser ablation, etching paste and ion etching, the insulating layer from regions of the second main surface to re-expose selected ones of the openings for soldering surfaces, in order to allow at least one of subsequent chemical and galvanic building-up of the soldering surfaces.

12. The method as recited in claim 11, further comprising:
at least one of galvanically and chemically depositing at least one solderable layer including at least one of nickel, silver, copper and tin onto the metallic contact tracks of the first main surface and into the selected ones of the openings for soldering surfaces of the second main surface;
wherein the building-up layer of the first main surface is different from the layer of the second main surface.

* * * * *

UNITED STATES PATENT AND TRADEMARK OFFICE
CERTIFICATE OF CORRECTION

PATENT NO. : 8,962,381 B2  
APPLICATION NO. : 13/642099  
DATED : February 24, 2015  
INVENTOR(S) : Hans-Joachim Krokoszinski Page 1 of 1

It is certified that error appears in the above-identified patent and that said Letters Patent is hereby corrected as shown below:

On the title page item 73 Assignee: Replace "Robert Bosch GmbH, Stuttgart (DE)" with --SolarWorld Industries Thueringen GmbH, Bonn (DE)--

Signed and Sealed this  
Nineteenth Day of April, 2016

Michelle K. Lee  
*Director of the United States Patent and Trademark Office*